(12) United States Patent
Nam et al.

(10) Patent No.: US 7,256,129 B2
(45) Date of Patent: Aug. 14, 2007

(54) METHOD FOR FABRICATING SEMICONDUCTOR DEVICE

(75) Inventors: Ki-Won Nam, Ichon-shi (KR); Jung-Taik Cheong, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/296,346

(22) Filed: Dec. 8, 2005

(65) Prior Publication Data
US 2006/0292882 A1   Dec. 28, 2006

(30) Foreign Application Priority Data
Jun. 28, 2005   (KR) .............. 10-2005-0056403

(51) Int. Cl.
*H01L 21/302* (2006.01)
(52) U.S. Cl. .............. 438/708; 438/709; 438/719; 438/736
(58) Field of Classification Search .............. 438/708, 438/709, 719, 736
See application file for complete search history.

(56) References Cited

U.S. PATENT DOCUMENTS 6,008,139 A * 12/1999 Pan et al. .................. 438/730
6,287,951 B1 * 9/2001 Lucas et al. ................ 438/618
2005/0167397 A1 * 8/2005 Chen et al. .................. 216/59
2006/0154487 A1 * 7/2006 Wang et al. ................ 438/714

FOREIGN PATENT DOCUMENTS

KR   10 2005-0038869   4/2005
KR   10 2005-0045723   5/2005

OTHER PUBLICATIONS

Notice of Preliminary Rejection issued on May 19, 2006, by the Korean Intellectual Property Office in counterpart Korean Application No. 2005-0056403 and English translation thereof.

* cited by examiner

*Primary Examiner*—Binh X. Tran
(74) *Attorney, Agent, or Firm*—Finnegan, Henderson, Farabow, Garrett, & Dunner, L.L.P.

(57) ABSTRACT

A method for fabricating a semiconductor device is provided. The method includes: forming an inter-layer insulation layer on a substrate; forming a hard mask layer on the inter-layer insulation layer; etching the hard mask layer using a contact mask; and etching the inter-layer insulation layer using the hard mask layer as an etch barrier, thereby obtaining an opening wherein the etching of the hard mask layer and the etching of the inter-layer insulation layer are performed in one etch chamber.

15 Claims, 2 Drawing Sheets

POLYSILICON ETCH CHAMBER

OXIDE ETCH CHAMBER

METHOD FOR FABRICATING SEMICONDUCTOR DEVICE

FIELD OF THE INVENTION

The present invention relates to a method for fabricating a semiconductor device; and, more particularly, to a method for forming a contact hole in a semiconductor device.

DESCRIPTION OF RELATED ARTS

As the dynamic random access memory (DRAM) devices are shrinking, the depth of an inter-layer insulation layer of a metal contact under 100 nm technology is increasing above 30,000 Å, and such increment in depth of the inter-layer insulation layer is expected to grow even higher as the devices are becoming more shrunken.

Especially for the devices of 90 nm level or under, the thickness of a photoresist is reduced, and a hard mask is formed with polysilicon as a solution to an increasing inter-layer insulation layer and a lack of photo-mask define ability. Hence, damage on a top contact portion caused by the decreased photoresist thickness is prevented by the polysilicon hard mask.

FIGS. 1A to 1B are cross-sectional views illustrating a conventional method for fabricating a semiconductor device.

As shown in FIGS. 1A to 1B, an inter-layer insulation layer 12 made of an oxide-based material is formed on a substrate 11. Then, a hard mask layer 13 is formed on the inter-layer insulation layer 12. The hard mask layer 13 is formed of polysilicon.

Referring to FIG. 1A, the hard mask layer 13 is etched in an etch chamber for a polysilicon layer to pattern the hard mask layer 13.

As shown in FIG. 1B, subsequently, the wafer is moved into an etch chamber for an oxide layer to etch the inter-layer insulation layer 12, and then the inter-layer insulation layer 12 is etched.

As described above, if the conventional technology is applied, and the hard mask layer and the inter-layer insulation layer are etched separately in different chambers, undesired particles may be generated while moving the wafer into the different chambers during the device formation, resulting in a decreased device yield.

SUMMARY OF THE INVENTION

It is, therefore, an object of the present invention to provide a method for forming a contact hole in a semiconductor device capable of simplifying the contact hole formation process and preventing a generation of undesired particles generally caused by an ex-situ etch process.

In accordance with an aspect of the present invention, there is provided a method for fabricating a semiconductor device, including: forming an inter-layer insulation layer on a substrate; forming a hard mask layer on the inter-layer insulation layer; etching the hard mask layer using a contact mask; and etching the inter-layer insulation layer using the hard mask layer as an etch barrier, thereby obtaining an opening wherein the etching of the hard mask layer and the etching of the inter-layer insulation layer are performed in one etch chamber.

BRIEF DESCRIPTION OF THE DRAWINGS

The above and other objects and features of the present invention will become better understood with respect to the following description of the specific embodiments given in conjunction with the accompanying drawings, in which.

DETAILED DESCRIPTION OF THE INVENTION

A method for fabricating a semiconductor device in accordance with specific embodiments of the present invention will be described in detail with reference to the accompanying drawings.

Figure 1A:
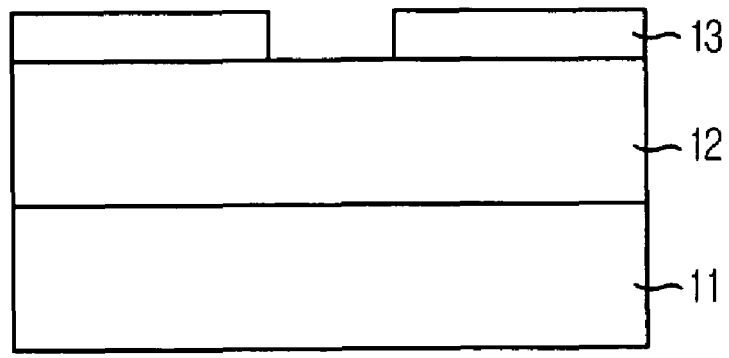
FIGS. 1A and 1B are cross-sectional views illustrating a conventional method for fabricating a semiconductor device.
Figure 1B:
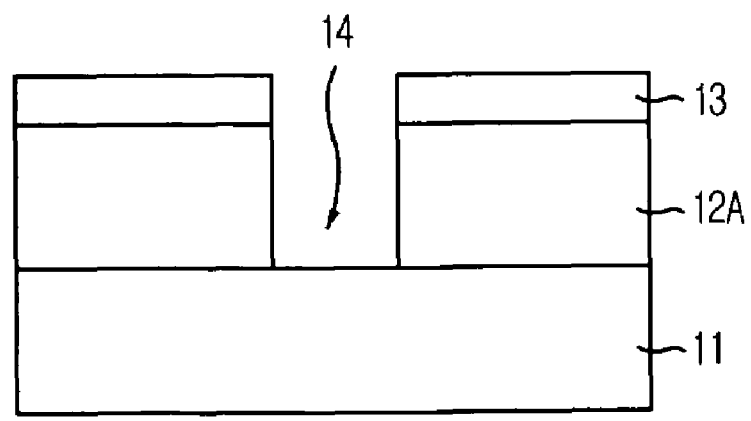
Figure 2:
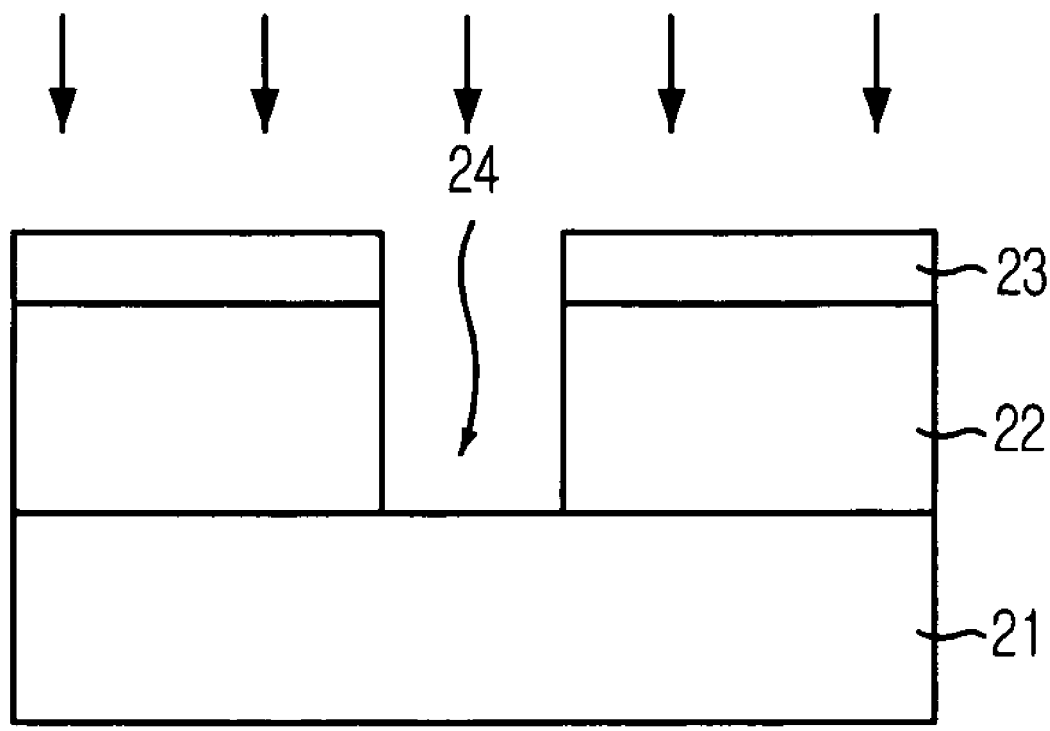
FIG. 2 is a cross-sectional view illustrating a method for fabricating a semiconductor device in accordance with a specific embodiment of the present invention.

FIG. 2 is a cross-sectional view illustrating a method for fabricating a semiconductor device in accordance with a specific embodiment of the present invention.

As shown in FIG. 2, an inter-layer insulation layer 22 is formed on a substrate 21. Then, a hard mask layer 23 is formed on the inter-layer insulation layer 22. Herein, the hard mask 23 includes polysilicon.

Subsequently, the wafer is loaded on an etch chamber for an oxide layer to form a contact hole, and an etch rate of the hard mask layer 23 in the above etch chamber should be maintained at approximately 1,000 Å per minute identical to that in another etch chamber for a polysilicon layer.

Therefore, the hard mask layer 23 is etched at a chamber pressure ranging from approximately 40 mtorr to approximately 100 mtorr with a power (e.g., a radio frequency (RF) power) ranging from approximately 200 W to approximately 1,000 W. Herein, oxygen gas is used, mixed with a fluorine-based gas, e.g., carbon tetrafluoride ($CF_4$) and trifluoromethane ($CHF_3$). To maintain the aforementioned etch rate of the hard mask layer 23, the oxygen gas flows at a quantity of flow ranging from approximately 10 sccm to approximately 50 sccm, and an amount of the fluorine-based gas, approximately 1.5 times larger than the amount of the oxygen gas, is added.

On the other hand, although the etch rate of the hard mask layer 23 is increasing as the amount of oxygen is increasing, too much oxygen gas may cause a side effect of increasing an ashing rate of a photoresist layer. To prevent such a limitation, a temperature of a chuck, whereon the wafer is located inside the chamber, should not be maintained at a normal temperature (i.e., approximately 20° C. to approximately 60° C.), but at a low temperature ranging from approximately −20° C. to approximately 20° C. Thus, the increasing ashing rate of a photoresist layer due to the addition of the oxygen gas can be reduced.

Furthermore, after the hard mask layer 23 is etched, the inter-layer insulation layer 22 is etched, thereby obtaining an opening 24, more particularly, a contact hole. Herein, the etching of the inter-layer insulation layer 22 is performed at a low temperature ranging from approximately −20° C. to approximately 20° C., and the pressure of the etch chamber for the oxide layer ranges from approximately 20 mtorr to approximately 100 mtorr. Also, a top power ranges from approximately 1,000 W to approximately 3,000 W, and a bottom power ranges from approximately 1,000 W to approximately 2,000 W. Herein, a quantity of flow of $C_4F_8$, $H_2F_2$, oxygen ($O_2$), and argon (Ar) ranges from approximately 10 sccm to approximately 40 sccm, from approximately 10 sccm to approximately 100 sccm, from approximately 5 sccm to approximately 30 sccm, and from approximately 100 sccm to approximately 1,000 sccm, respectively.

In accordance with the specific embodiment of the present invention, the process steps can be simplified by performing the etching of the hard mask layer and the inter-layer insulation layer in one etch chamber instead of two separate etch chambers. Thus, it is possible to prevent the undesired particles generally caused by the moving of the wafer, resulting in an improved device yield.

The present application contains subject matter related to the Korean patent application No. KR 2005-0056403, filed in the Korean Patent Office on Jun. 28, 2005, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming an inter-layer insulation layer on a substrate;
    forming a hard mask layer on the inter-layer insulation layer;
    etching the hard mask layer using a contact mask; and
    etching the inter-layer insulation layer using the hard mask layer as an etch barrier, thereby obtaining an opening,
    wherein the etching of the hard mask layer and the etching of the inter-layer insulation layer are performed in one etch chamber and etching of the inter-layer insulation layer is performed by utilizing $C_4F_8$ gas, $H_2F_2$ gas, oxygen ($O_2$) gas, and argon (Ar) gas.

2. The method of claim 1, wherein the etch chamber is used to etch an oxide layer.

3. The method of claim 1, wherein the hard mask layer includes polysilicon.

4. The method of claim 1, wherein the etching of the hard mask layer maintains an etch rate of approximately 1,000 Å per minute.

5. The method of claim 1, wherein the etching of the inter-layer insulation layer using the etched hard mask layer as the etch barrier in the same etch chamber where the hard mask layer is etched is performed at an etch chamber pressure ranging from approximately 20 mtorr to approximately 100 mtorr.

6. The method of claim 1, wherein the etching of the inter-layer insulation layer using the etched hard mask layer as the etch barrier in the same etch chamber where the hard mask layer is etched is performed with a top power ranging from approximately 1,000 W to approximately 3,000 W, and a bottom power ranging from approximately 1,000 W to approximately 2,000 W.

7. The method of claim 1, wherein the $C_4F_8$ gas flows at a quantity ranging from approximately 10 sccm to approximately 40 sccm.

8. The method of claim 1, wherein the $H_2F_2$ gas flows at a quantity ranging from approximately 10 sccm to approximately 100 sccm.

9. The method of claim 1, wherein the $O_2$ gas flows at a quantity ranging from approximately 5 sccm to approximately 30 sccm.

10. The method of claim 1, wherein the Ar gas flows at a quantity ranging from approximately 100 sccm to approximately 1,000 sccm.

11. The method of claim 1, wherein the hard mask layer is etched using a mixed etch gas including a fluorine-based gas and oxygen gas.

12. The method of claim 11, wherein the oxygen gas flows at a quantity of flow ranging from approximately 10 sccm to approximately 50 sccm, and the fluorine-based gas flows at a quantity of flow ranging from approximately 15 sccm to approximately 75 sccm.

13. The method of claim 11, wherein the etching of the hard mask layer is performed at a chamber pressure ranging from approximately 40 mtorr to approximately 100 mtorr.

14. The method of claim 11, wherein the etching of the hard mask layer is performed with a radio frequency (RE) power ranging from approximately 200 W to approximately 1,000 W.

15. The method of claim 11, wherein the etching of the hard mask layer is performed at a temperature ranging from approximately −20° C. to approximately 20° C.

* * * * *